US010304654B2

(12) United States Patent
Ikegami et al.

(10) Patent No.: US 10,304,654 B2
(45) Date of Patent: May 28, 2019

(54) CHARGED PARTICLE BEAM DEVICE

(71) Applicant: Hitachi High-Technologies Corporation, Minato-ku, Tokyo (JP)

(72) Inventors: Akira Ikegami, Tokyo (JP); Yuta Kawamoto, Tokyo (JP); Hideto Dohi, Tokyo (JP); Manabu Yano, Tokyo (JP); Yutaka Tandai, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/747,847

(22) PCT Filed: Jul. 27, 2016

(86) PCT No.: PCT/JP2016/071942
§ 371 (c)(1),
(2) Date: Jan. 26, 2018

(87) PCT Pub. No.: WO2017/018432
PCT Pub. Date: Feb. 2, 2017

(65) Prior Publication Data
US 2018/0233320 A1    Aug. 16, 2018

(30) Foreign Application Priority Data
Jul. 29, 2015   (JP) .................. 2015-149165

(51) Int. Cl.
*H01J 37/04*    (2006.01)
*H01J 37/21*    (2006.01)
(Continued)

(52) U.S. Cl.
CPC ............ *H01J 37/147* (2013.01); *H01J 37/04* (2013.01); *H01J 37/21* (2013.01); *H01J 37/248* (2013.01);
(Continued)

(58) Field of Classification Search
CPC .......... H01J 37/28; H01J 37/147; H01J 37/04; H01J 37/21; H01J 37/05; H01J 37/153;
(Continued)

(56) References Cited

U.S. PATENT DOCUMENTS 5,412,210 A * 5/1995 Todokoro ............... G01B 15/04
250/306
6,847,038 B2 * 1/2005 Todokoro ............. G01N 23/225
250/305
(Continued)

FOREIGN PATENT DOCUMENTS

JP    55-146851 A    11/1980
JP    60-243959 A    12/1985
(Continued)

OTHER PUBLICATIONS

International Search Report (PCT/ISA/210) issued in PCT Application No. PCT/JP2016/071942 dated Nov. 15, 2016 with English-language translation (Eight (8) pages).
(Continued)

*Primary Examiner* — David A Vanore
(74) *Attorney, Agent, or Firm* — Crowell & Moring LLP

(57) ABSTRACT

A purpose of the present invention is to provide a charged particle beam device that suppresses an off-axis amount when a field of view moves, said move causing an aberration, and allows large field of view moves to be carried out. In order to achieve the above-mentioned purpose, this charged particle beam device is provided with an objective lens and deflectors for field of view moves, said deflectors deflecting a charged particle beam, and is further provided with an accelerating tube positioned between the objective lens and the deflectors for field of view moves, a power source that applies a voltage to the accelerating tube, and a control device that controls the voltage to be applied to the (Continued)

power source in response to the deflection conditions of the deflectors for field of view moves.

15 Claims, 10 Drawing Sheets

(51) Int. Cl.
    *H01J 37/147*     (2006.01)
    *H01J 37/248*     (2006.01)
    *H01J 37/28*     (2006.01)

(52) U.S. Cl.
    CPC ....... *H01J 37/28* (2013.01); *H01J 2237/0473* (2013.01)

(58) Field of Classification Search
    CPC ....... H01J 2237/0473; H01J 2237/1501; H01J 2237/004; H01J 2237/0475; H01J 2237/053; H01J 2237/063; H01J 2237/1508; H01J 2237/24475; H01J 2237/24578; H01J 2237/24585; H01J 2237/28
    USPC ..... 250/311, 306, 307, 305, 310, 397, 492.2
    See application file for complete search history.

(56) References Cited

U.S. PATENT DOCUMENTS

| | | | | |
|---|---|---|---|---|
| 2003/0209667 A1* | 11/2003 | Petrov | ................ | G01N 23/22 250/310 |
| 2004/0056207 A1* | 3/2004 | Petrov | ................ | H01J 37/1475 250/396 ML |
| 2004/0064283 A1* | 4/2004 | Preiksas | ................ | H01J 37/265 702/107 |
| 2005/0012049 A1* | 1/2005 | Bierhoff | ................ | H01J 37/07 250/396 ML |
| 2008/0116375 A1* | 5/2008 | Ikegami | ................ | G01N 23/225 250/307 |
| 2009/0039264 A1* | 2/2009 | Ikegami | ................ | H01J 37/21 250/311 |
| 2009/0224170 A1* | 9/2009 | Yamazaki | ................ | H01J 37/244 250/397 |
| 2009/0272899 A1* | 11/2009 | Yamazaki | ................ | H01J 37/28 250/307 |
| 2012/0286160 A1 | 11/2012 | Ohashi et al. | | |
| 2014/0014836 A1* | 1/2014 | Isawa | ................ | G01N 23/2258 250/310 |
| 2015/0014531 A1* | 1/2015 | Yamazaki | ................ | H01J 37/244 250/311 |
| 2016/0217968 A1* | 7/2016 | Li | ................ | H01J 37/145 |
| 2016/0217969 A1* | 7/2016 | Mizuhara | ................ | H01J 37/04 |
| 2016/0300690 A1* | 10/2016 | Ikegami | ................ | H01J 37/147 |
| 2018/0233320 A1* | 8/2018 | Ikegami | ................ | H01J 37/04 |

FOREIGN PATENT DOCUMENTS

| | | |
|---|---|---|
| JP | 2010-16002 A | 1/2010 |
| JP | 2010-175249 A | 8/2010 |
| JP | 2013-54908 A | 3/2013 |
| JP | 2014-53074 A | 3/2014 |
| JP | 5677677 B2 | 2/2015 |

OTHER PUBLICATIONS

Japanese-language Written Opinion (PCT/ISA/237) issued in PCT/JP2016/071942 dated Nov. 15, 2016 (Five (5) pages).

* cited by examiner

[Fig. 1]
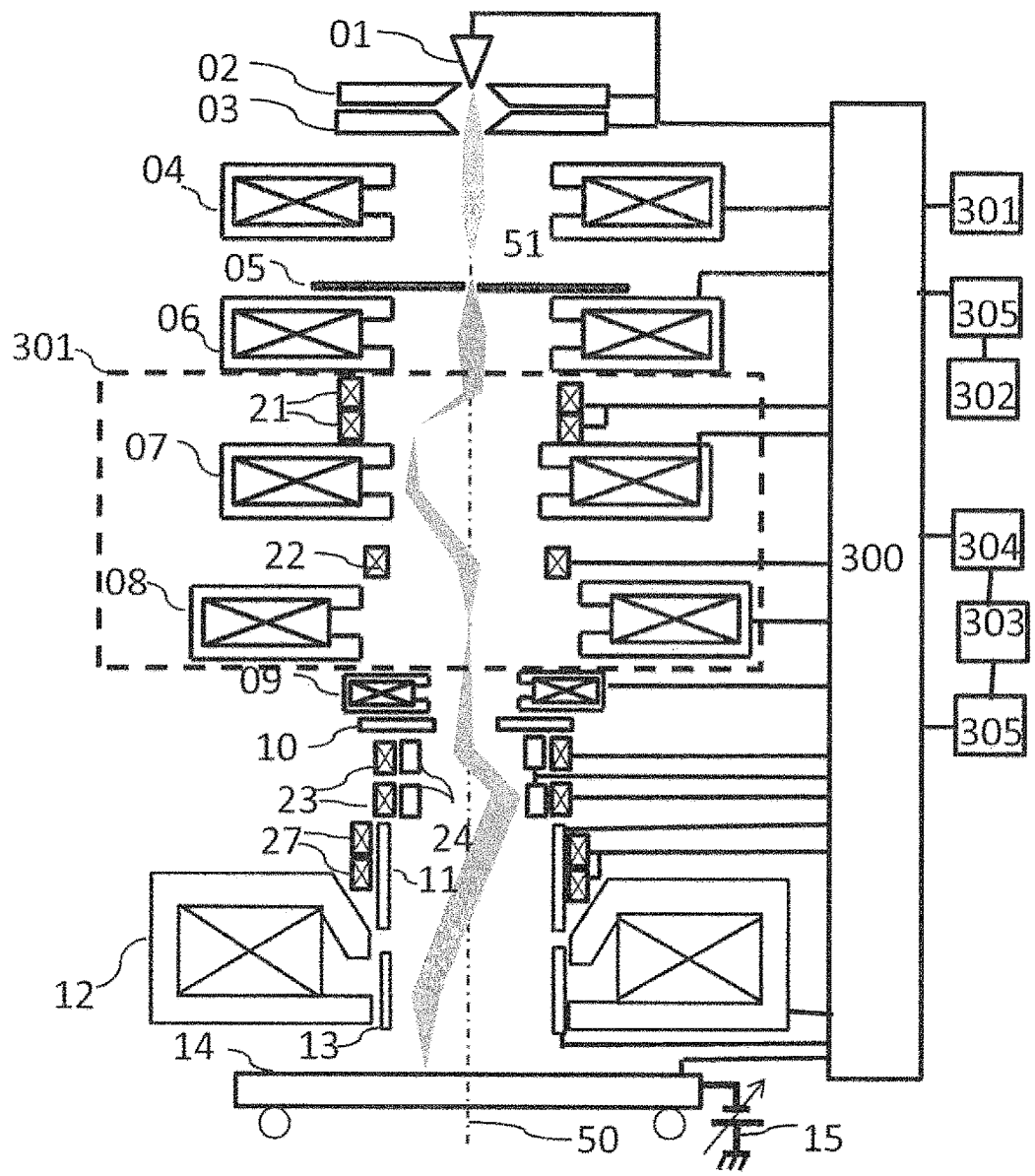

[Fig. 2]
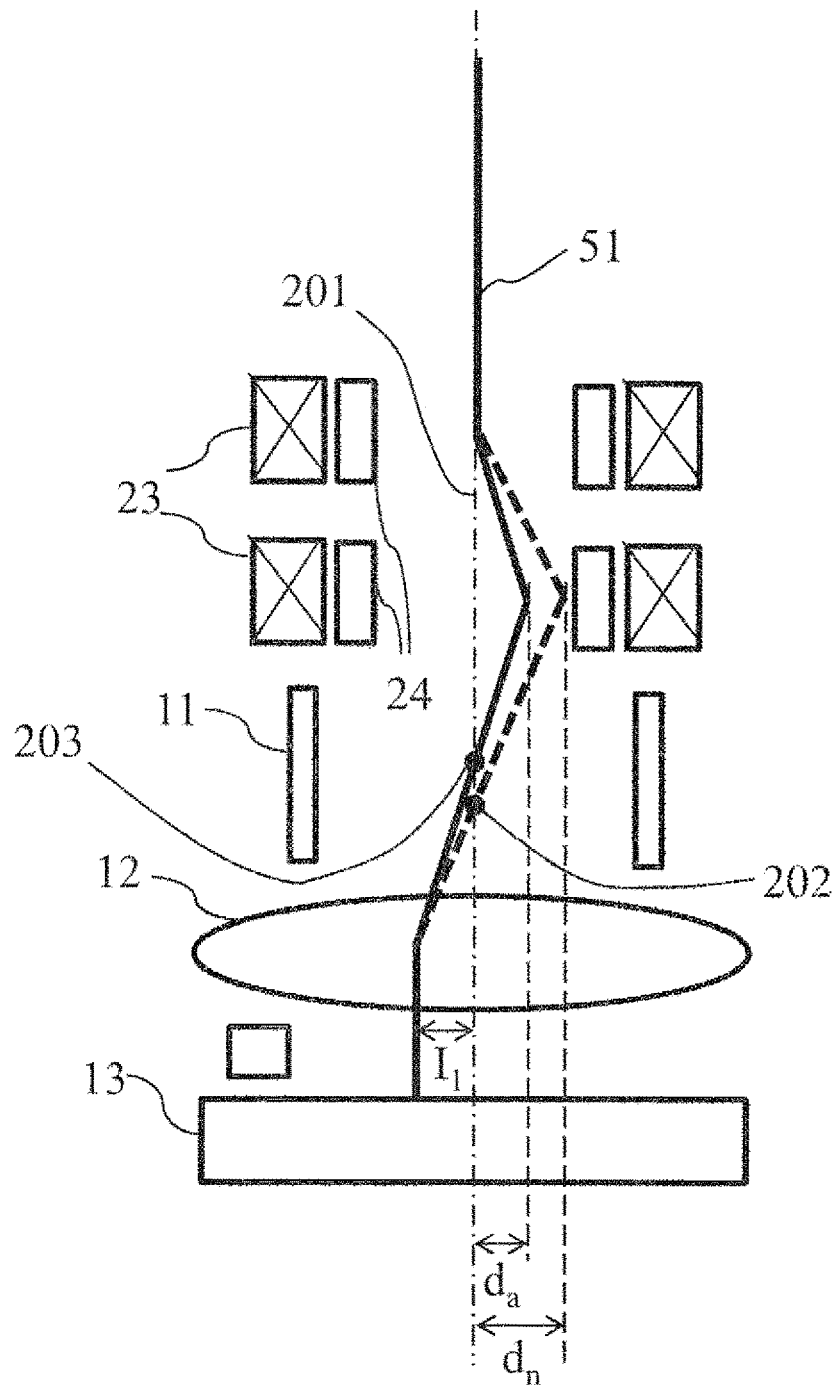

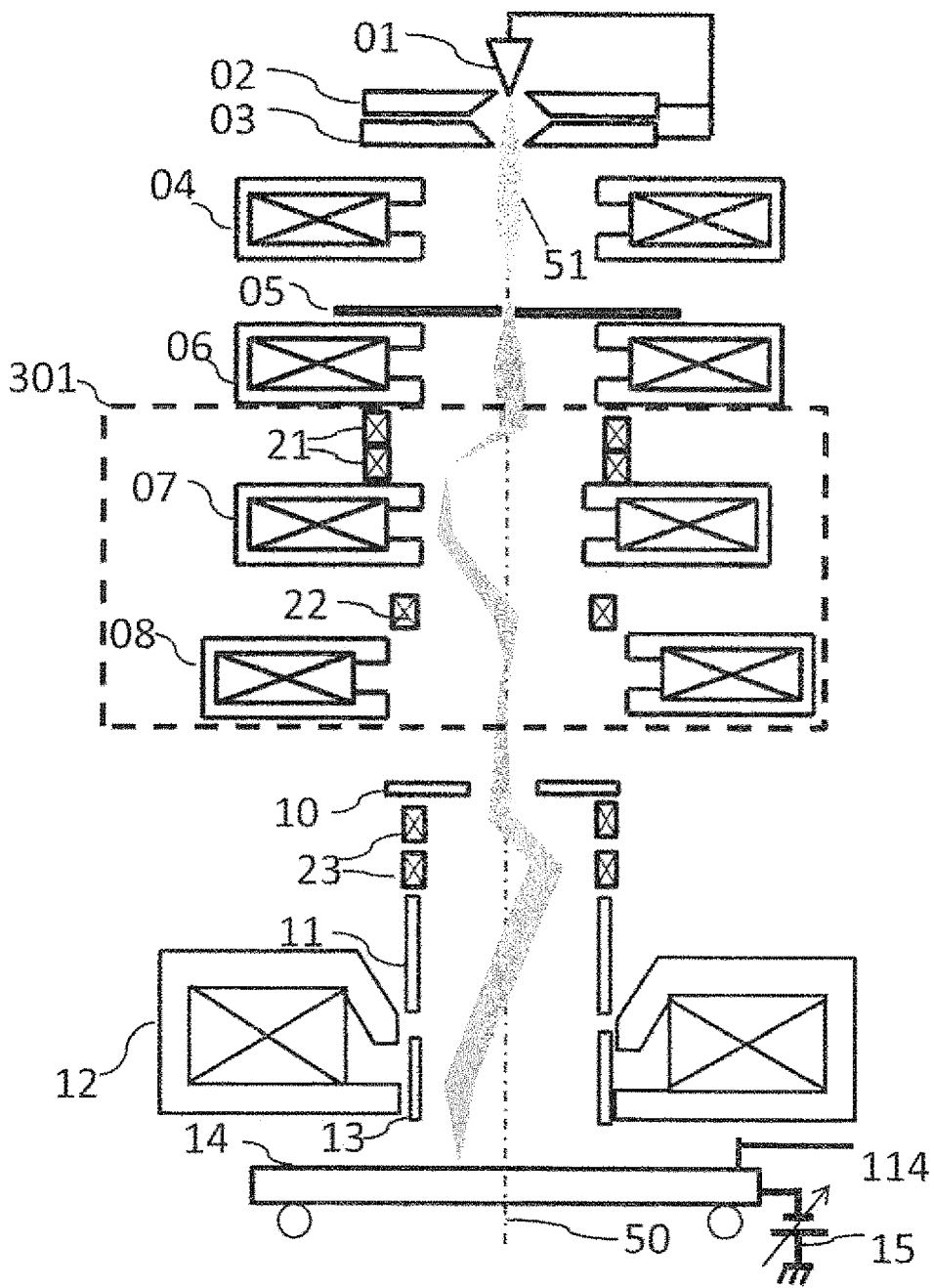
[Fig. 3]

[Fig. 4]
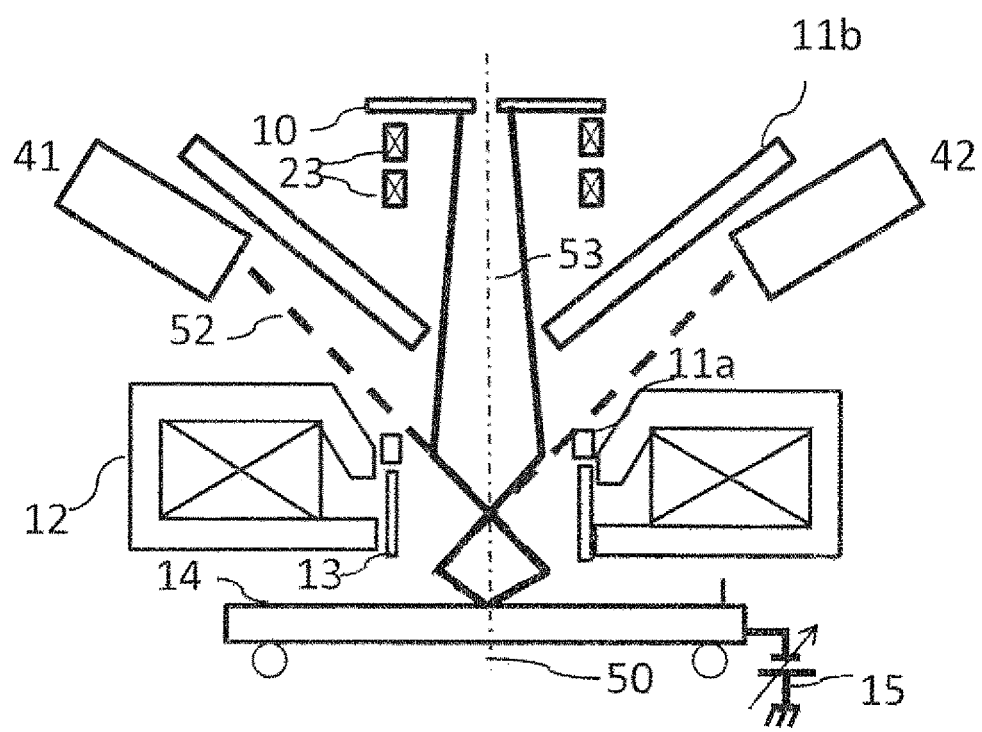

[Fig. 5]
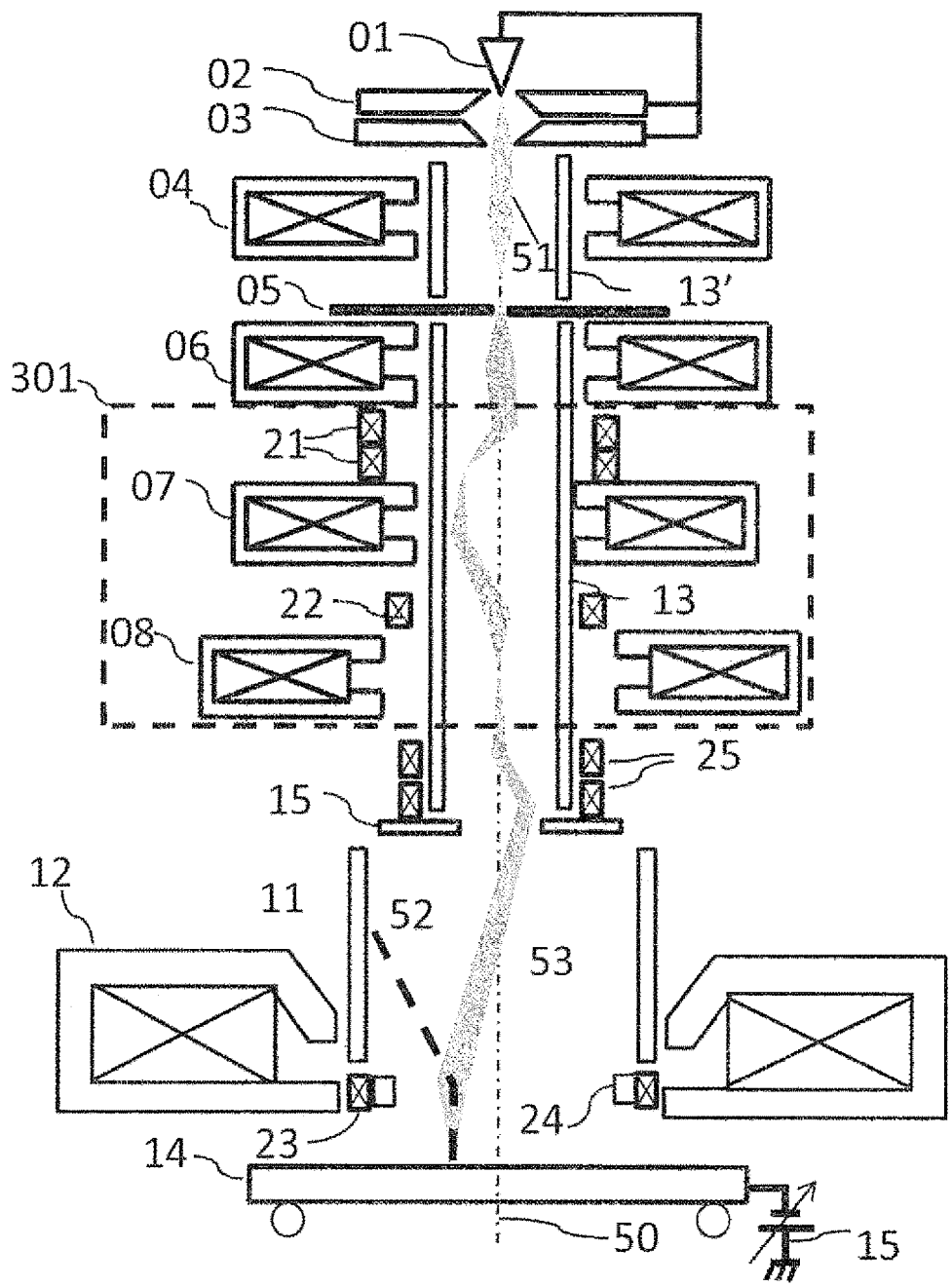

[Fig. 6]
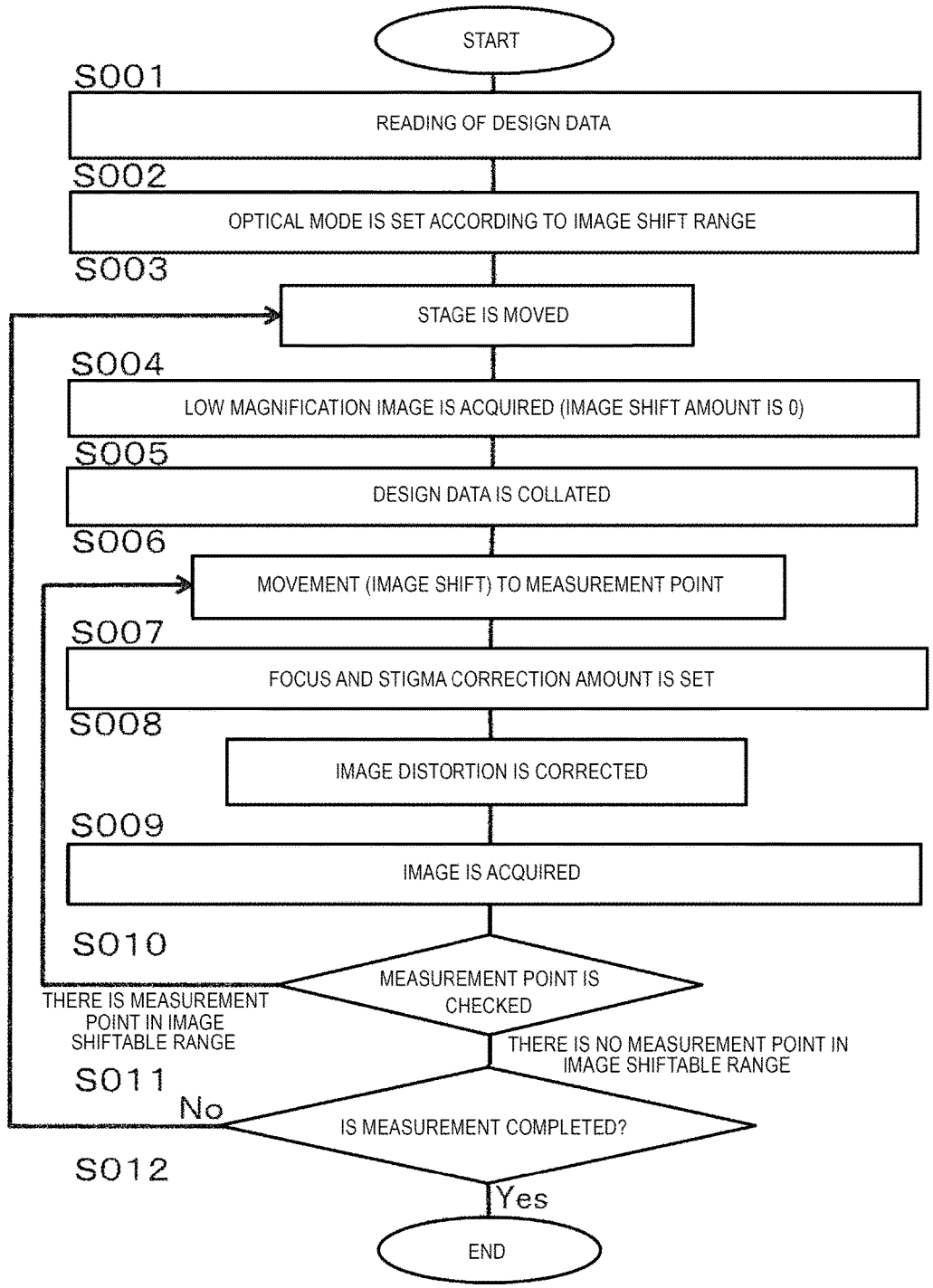

[Fig. 7]
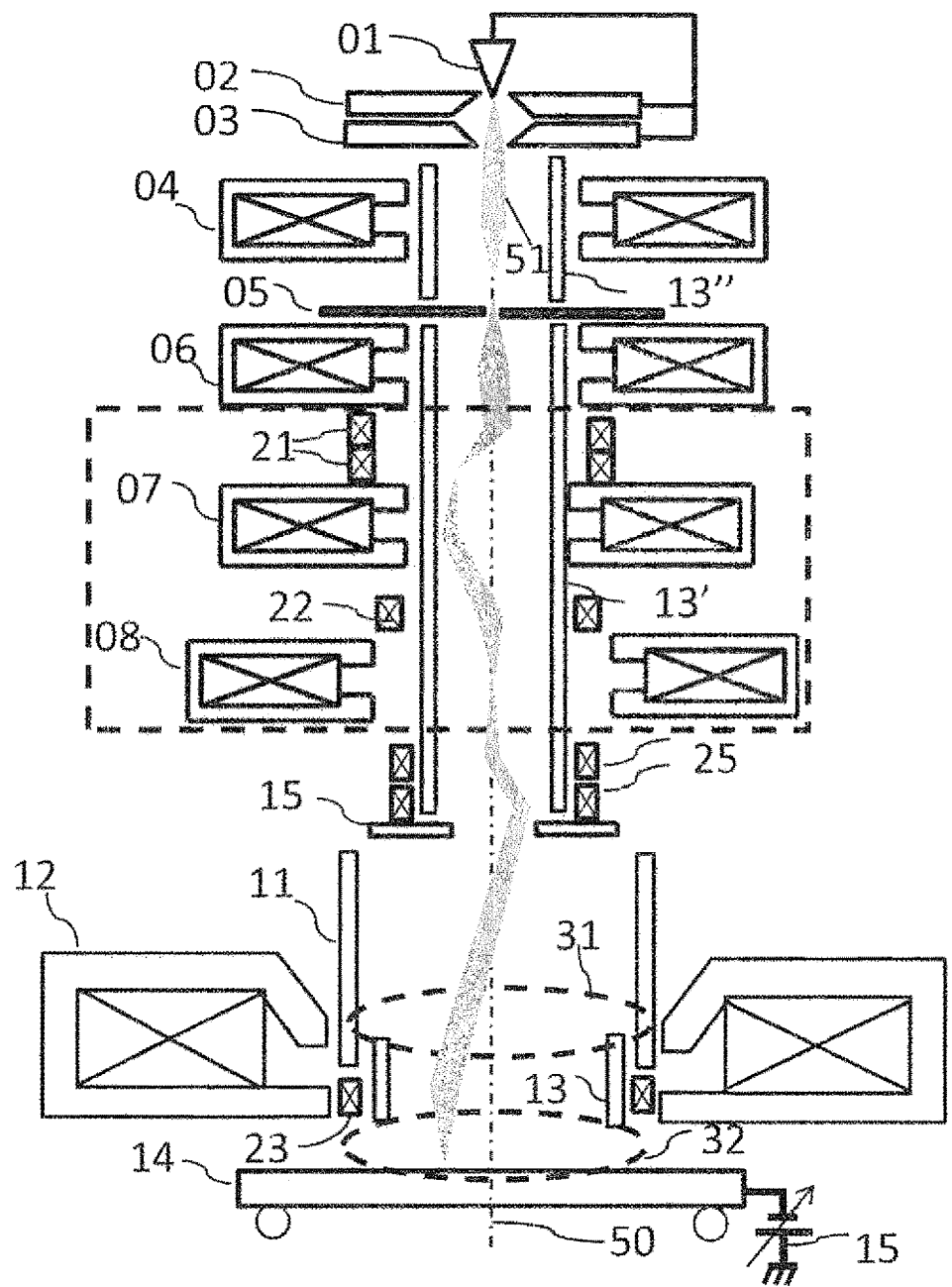

[Fig. 8]
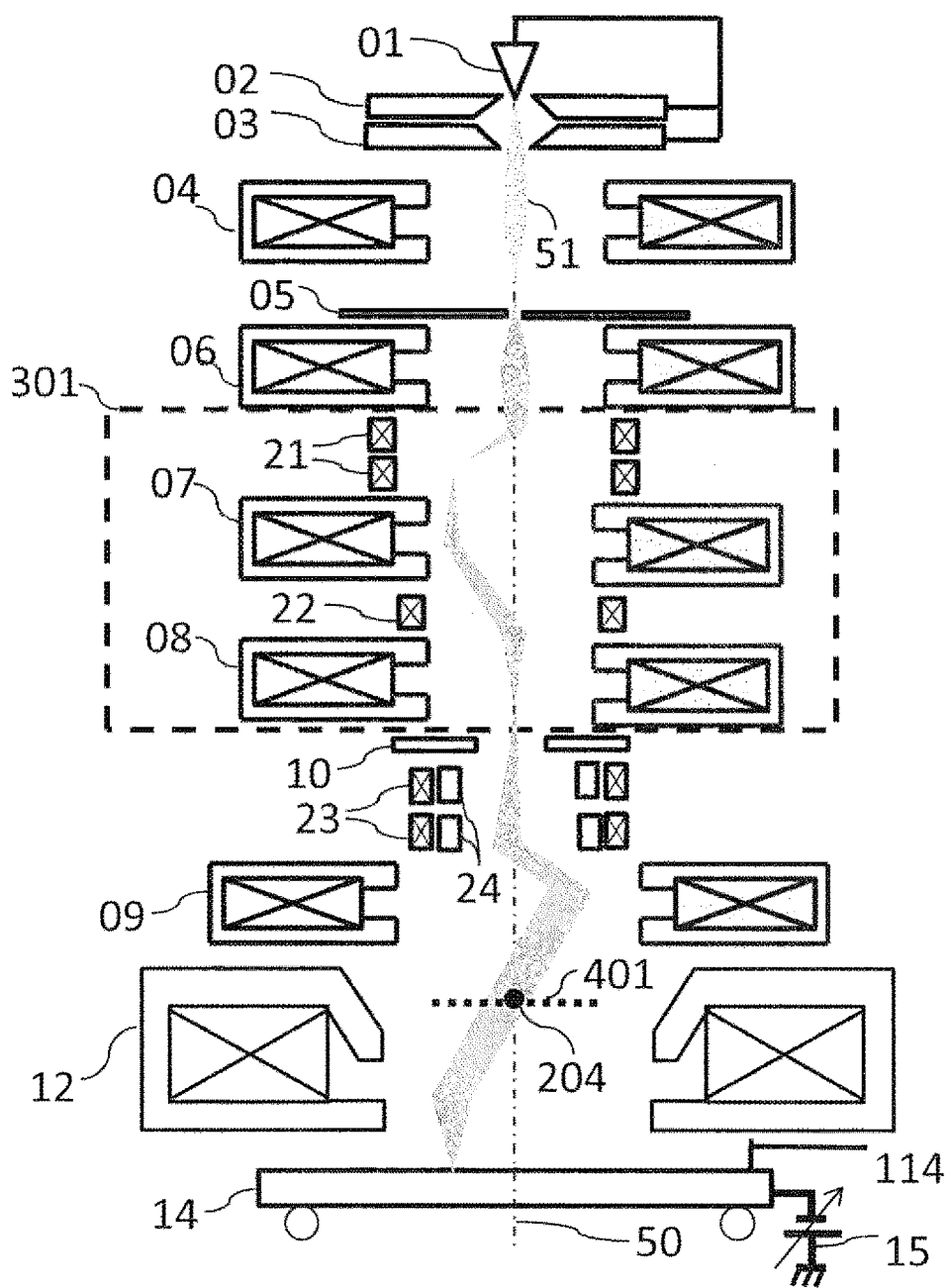

[Fig. 9]
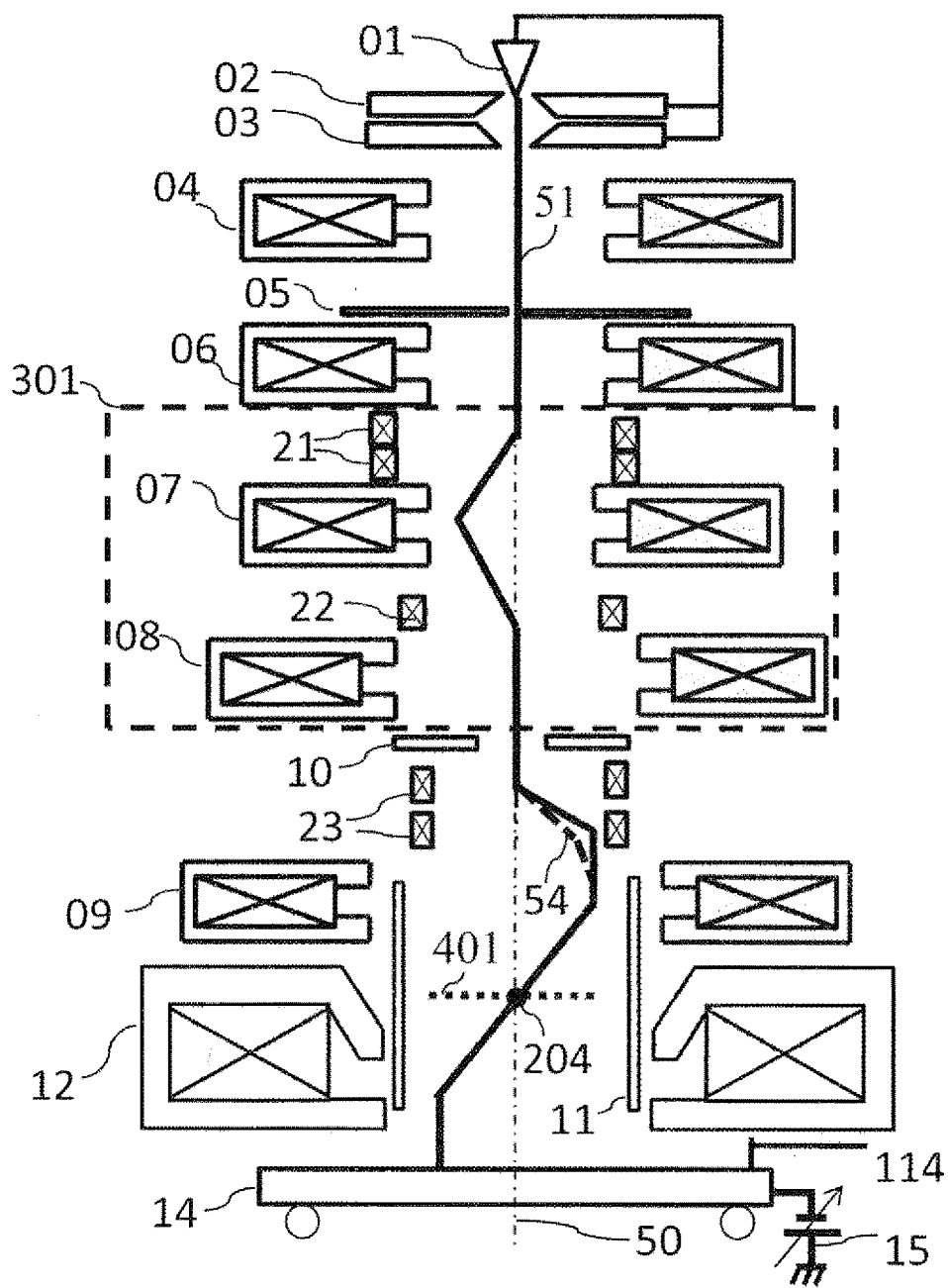

[Fig. 10]
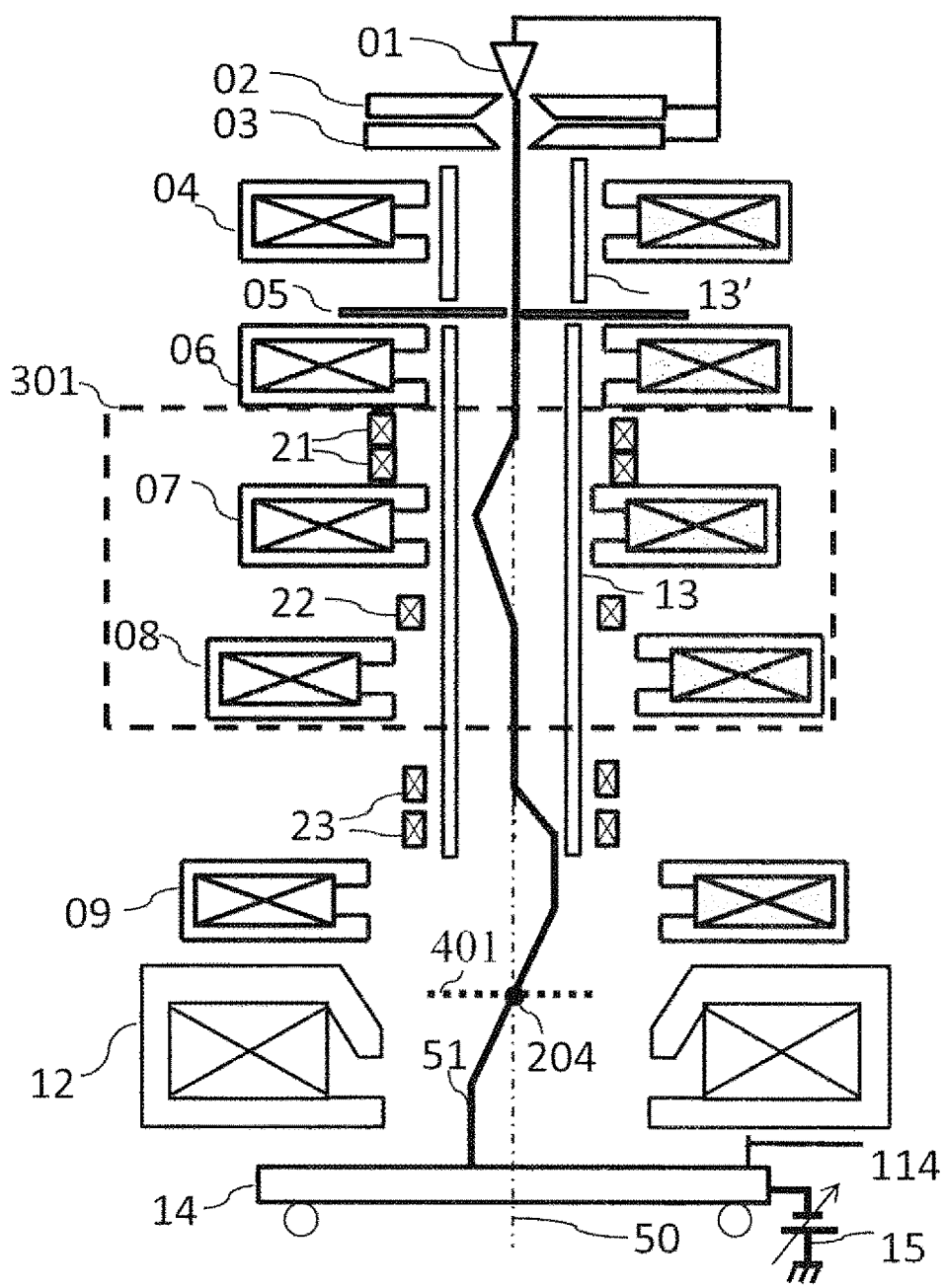

CHARGED PARTICLE BEAM DEVICE

TECHNICAL FIELD

The present invention relates to a charged particle beam device and more particularly to a charged particle beam device including a deflector for moving a position of a field of view.

BACKGROUND ART

Due to miniaturization and high integration of a semiconductor device, a design and a manufacturing process are becoming more complicated. On the other hand, a charged particle beam device such as a scanning electron microscope is used for measurement and inspection of a fine semiconductor device pattern. The scanning electron microscope is a device that performs measurement and inspection using an image or the like obtained by scanning a focused electron beam on a sample. With the recent complication and miniaturization of the semiconductor device, demands for more measurement and inspection are intensified in a short period of time.

In order to perform many measurements or inspections in a short period of time, it is necessary to position the field of view (FOV) of the scanning electron microscope at high speed in a region including a measurement point and an inspection point. A deflector (hereinafter, also referred to as an image shift deflector), which deflects an electron beam so as to perform such a movement of the field of view, is known. In PTL 1, a charged particle beam device including an image shift deflector and an aberration corrector that corrects an aberration generated when an image is shifted in accordance with a moving amount of image shift is disclosed. In PTL 2, a charged particle beam device includes a control device that controls an optical system so that a landing angle (incident angle of the electron beam with respect to a sample) is vertical irrespective of an image shift amount, and a corrector for correcting an aberration of astigmatism or the like generating at that time.

CITATION LIST

Patent Literature

PTL 1: JP-A-2014-53074
PTL 2: Japanese Patent No. 5677677 (corresponding to US Patent Publication No. US2012/0286160)

SUMMARY OF INVENTION

Technical Problem

As described in PTLs 1 and 2, even in a case where the electron beam is off-axis from an ideal optical axis for the image shift, it is possible to suppress the aberration generated at that time by correcting the aberration, which generates when the image shift is performed, by using the aberration corrector or the like. However, if a deflection range due to the image shift is large, an aberration amount generating in an objective lens is large and simultaneously, the aberration generated from a harmonic component of the deflector becomes apparent. Therefore, it may be difficult for the aberration corrector to correct the aberration.

In addition, it is preferable that both a deflection chromatic aberration and a deflection geometric aberration are simultaneously corrected. In order to simultaneously correct the deflection chromatic aberration and the deflection geometric aberration when the field of view is moved by the aberration corrector, it is necessary to adjust a multipole element and a rotationally symmetric lens included in the aberration corrector, a voltage or a current value applied to the deflector, and an incident condition and an emission condition to the aberration corrector in response to a moving amount and a moving direction of the field of view, and complicated control is required.

In addition, if the moving amount of the field of view is large, focus deviation is generated due to a field curvature aberration of the objective lens so that the focus has to be corrected with either lens. In this case, if a lens on an electron source side from an objective lens object point is used, a position of the objective lens object point fluctuates and a deflection sensitivity (image moving amount per unit current) of the deflector for moving the field of view changes. A time until a current settles at a set value is constant regardless of the position of the objective lens object point when the current is applied to the deflector for moving the field of view, so that if the deflection sensitivity changes, a time until an image can be acquired from an input of a field of view moving signal fluctuates. That is, since a waiting time from the field of view moving signal to the image acquisition varies in response to the moving amount of the field of view, a throughput is reduced. In addition, in a case where focus adjustment is performed with the objective lens, hysteresis or heat generation due to a change in a current amount of the objective lens becomes a problem. These effects lead to an increase in the waiting time until the image acquisition and complication of control.

Furthermore, if the moving amount of the field of view is large, an off-axis amount until the position of the deflector for moving the field of view increases, so that the aberration generated from the harmonic component of an electromagnetic field of the deflector may become apparent. Since it is difficult for the aberration corrector or a lens to correct the aberration, control for reducing the aberration is necessary.

In the following, a charged particle beam device, of which a first object is to perform a large movement of a field of view while suppressing an off-axis amount when the field of view is moved which is a factor of aberration generation, is proposed. Furthermore, a charged particle beam device, of which a second object is to simultaneously correct a deflection chromatic aberration and a deflection geometric aberration, is proposed.

Solution to Problem

As an aspect for achieving the first object, it is proposed a charged particle beam device including an objective lens that focuses a charged particle beam emitted from a charged particle source and irradiates a sample with the charged particle beam, and a deflector for moving a field of view, which deflects the charged particle beam, the device including an accelerating tube that is disposed between the deflector for moving the field of view and the objective lens; a power source that applies a voltage to the accelerating tube; and a control device that controls a voltage applied to the power source according to a deflection condition of the deflector for moving the field of view. As an aspect for achieving the second object, it is proposed a charged particle beam device including an objective lens that focuses a charged particle beam emitted from a charged particle source and irradiates a sample with the charged particle beam, and a deflector for moving a field of view, which deflects the charged particle beam, the device including a focus adjusting lens that is disposed between the objective lens object point and the objective lens; an accelerating tube that is disposed between the charged particle source and a sample; and a power source that applies a voltage or a current to the focus adjusting lens and the accelerating tube, in which a voltage or a current applied to the power source is controlled according to a deflection condition of the deflector for moving the field of view.

Advantageous Effects of Invention

According to the first aspect, it is possible to realize both suppression of the off-axis amount from the ideal optical axis of the charged particle beam and a large movement of the field of view. In addition, according to the second aspect, when the field of view is moved in a large region, it is possible to realize a large movement of the field of view with high speed and high accuracy while simultaneously performing simultaneous correction of the deflection chromatic aberration and the deflection geometric aberration, focus correction for keeping a waiting time until image acquisition constant, and suppression of the off-axis amount when the field of view is moved to reduce the aberration by the harmonic component of the deflector.

BRIEF DESCRIPTION OF THE DRAWINGS

FIG. 1 is view for explaining an outline of a scanning electron microscope including a deflector for moving a field of view.

FIG. 2 is a view illustrating a trajectory of an electron beam when the field of view is moved by using the deflector for moving the field of view.

FIG. 3 is a view for explaining an outline of a scanning electron microscope including a deflector for moving the field of view.

FIG. 4 is a view for explaining a trajectory of electrons when a voltage is applied to an accelerating tube disposed in the vicinity of an objective lens.

FIG. 5 is a view illustrating an outline of a scanning electron microscope including a deflector for moving the field of view on a sample side from the accelerating tube.

FIG. 6 is a flowchart illustrating an optical condition setting step of the scanning electron microscope.

FIG. 7 is a view illustrating an example of a scanning electron microscope including a plurality of accelerating tubes and a deflector for moving the field of view.

FIG. 8 is a view for explaining an outline of a scanning electron microscope including a deflector for moving the field of view.

FIG. 9 is a view for explaining an outline of a scanning electron microscope including an accelerating tube, a focusing lens, and a deflector for moving the field of view.

FIG. 10 is a view for explaining an outline of a scanning electron microscope including an accelerating tube, a focusing lens, and a deflector for moving the field of view.

DESCRIPTION OF EMBODIMENTS

Due to miniaturization and high integration of a semiconductor device, a design and a manufacturing process are becoming more complicated. Measuring points necessary for improving yield increase. Therefore, there is a strong demand for multi-point high-speed measurement for a measurement/inspection apparatus of a semiconductor device using a scanning electron microscope. In order to perform the multi-point high-speed measurement, it is effective to shorten a moving time to each measurement point. As a method of moving to different measurement points, there are a method of positioning a field of view at a target position on a sample by driving a stage including a table for placing the sample and a method of moving (image shift) a field of view by deflecting the beam.

Since the stage movement involves a mechanical operation, it takes a considerable amount of time for the movement. In addition, positioning accuracy is low with respect to the image shift. On the other hand, for example, even if a large movement of 100 mm or more is performed, a high quality image can be acquired. Meanwhile, since the image shift controls a deflection amount according to a current to be supplied and a voltage to be applied to a deflector, it has an advantage of being capable of moving the field of view more accurately in a shorter period of time than the stage movement. However, for example, if the field of view is moved several ten μm or more, the beam is largely off-axis from an ideal optical axis so that image quality may be degraded.

For the above reasons, it is preferable that the stage is moved in a range of several ten μm capable of performing the image shift and highly accurate movement to the measurement point is performed by using the image shift so that highly accurate positioning is performed.

In a case where the measurement of a sample, of which a density of a measurement point is high such as a hot spot analysis of a logic device, is performed, if it is possible to achieve both the image shift of several hundred μm and a high quality image acquisition, it is possible to grasp a plurality of measurement points within a range of the image shift. Therefore, the number of times of the stage movement when the measurement is performed is reduced and the time required for the multi-point measurement can be greatly shortened. When the image shift is performed, a trajectory of a primary electron fluctuates due to deflection action, so that the landing angle and resolution are reduced. In order to suppress deterioration of the resolution at the time of the image shift, it is conceivable to pass the deflected primary electron through a center of the objective lens. When the method is used, the trajectory of the primary electron passes through the center of the objective lens, so that the landing angle fluctuates in proportion to the image shift amount. On the other hand, in order to make the landing angle vertical, the primary electron may pass through the position of the front focus of the objective lens. If the trajectory is selected, the primary electron travels in the objective lens to be off-axis, so that the deflection chromatic aberration, a deflection coma aberration, or the deflection geometric aberration generates, and the resolution and the movement accuracy of the field of view are lowered. The phenomenon becomes more apparent as the image shift increases.

In order to perform the high-accuracy, high-speed, and multi-point measurement, it is necessary to suppress both the reduction of the resolution and fluctuation of the landing angle. Furthermore, there is a demand for discrimination detection of a secondary electron (SE) and backscattered electron (BSE) emitted to a specific trajectory, or the like. For example, in a case where the discrimination detection of the BSE is performed according to an emission direction, it is conceivable to use a scanning electron microscope including a detector having a detection surface divided into four. In addition, if the objective lens is short focused, the resolution is improved so that there is also a demand for shortening of a focal length of the device.

FIG. 2 is a view illustrating a trajectory of an electron beam deflected by an image shift deflector (deflector for moving the field of view). Because of vertical landing (beam reaching the sample is vertical with respect to the sample surface or parallel to the ideal optical axis of the electron beam), the primary electron (electron beam) is set to be pass through the front focus of the objective lens by a two-stage deflector. Under such an optical condition, if shortening of the focal length of the objective lens is realized, a front focal distance (distance between an objective lens main surface and an intersection point of the electron beam directly above the objective lens and the ideal optical axis of the electron beam) is shortened. More specifically, due to the short focal length, an inclination of the primary electron at the front focus increases and an off-axis amount (dn) at a lower-stage deflector position increases. Therefore, it is necessary to install a deflector capable of accurately providing a large deflection angle with respect to the primary electron passing through a position out of the center, which severely restricts a design of the deflector and a power source specification. In addition, a focal distance of the secondary electron emitted from a position deviated from the optical axis by the image shift is also shortened, so that the secondary electron is largely off-axis after passing through the objective lens and the yield is reduced. Furthermore, if a deflection intensity of the deflector is increased to perform a large image shift, the electrons emitted from the sample is deflected by the image shift deflector. Due to the deflection, for example, the trajectory of signal electrons fluctuates when the image shift of several hundred □m is executed and a detection efficiency of the electrons is lowered.

As described above, in order to perform the high-accuracy, high-speed, and multi-point measurement, it is necessary to realize suppression of degradation of the resolution and fluctuation of the trajectory of the secondary electron, and the vertical landing when the image shift is performed. In order to obtain such a beam condition, it is conceivable to suppress generation of aberration which is generated when the image shift is performed. However, for example, even if an astigmatism aberration or the like is eliminated by using an astigmatism correction coil or the like, it is impossible to eliminate an off-axis (deflection) chromatic aberration caused by the electron beam passing through a position out of the axis of the objective lens. As a result, the resolution may be lowered. In addition, even if suppression of the aberration generated when the image shift is performed by using the aberration corrector configured of the multipole element is attempted, lowering of the detection efficiency of the electrons generated when the image shift is performed cannot be suppressed. Furthermore, in a case where the aberration is corrected by using the aberration corrector, in order to establish a correction condition of the aberration, it is necessary to fix an incident condition and an emission condition to the aberration corrector. In a case where it is necessary to change the focal distance of the objective lens due to a change of an optical mode or the like, the correction condition of the aberration cannot be established, so that the deflection chromatic aberration cannot be corrected.

In the example described below, even in a case where a large movement of the field of view is performed, it is possible to realize both high speed of the measurement and inspection by enabling the large movement of the field of view by suppressing the off-axis amount of the beam accompanying the movement of the field of view and high accuracy of the measurement and inspection based on reduction of the aberration by suppressing the off-axis amount. In other words, the example relates to a charged particle beam device in which an optical condition which does not generate aberration by suppressing the off-axis amount itself of the beam with respect to the ideal optical axis, which causes the generation of the aberration instead of correcting the generated aberration. It goes without saying that the example does not deny realizing further higher accuracy by simultaneously using the aberration corrector.

FIG. 1 is a view illustrating an example of the scanning electron microscope including a deflector for moving a field of view. As a first example, the scanning electron microscope illustrated in FIG. 1 includes an aberration correcting unit 301 having two rotationally symmetric lenses 07 and 08, a first aberration correcting deflector 21, and a second aberration correcting deflector 22. In addition, an image shift deflector configured of a magnetic field type deflector 23 and an electrostatic type deflector 24, and an accelerating tube 11 which is disposed between the image shift deflector and a main surface of an objective lens 12, and to which a predetermined voltage is applied are provided. A positive voltage is applied from a power source (not illustrated) to the accelerating tube 11 according to an image shift amount (signal amount of the magnetic field type deflector 23 and the electrostatic type deflector 24). In addition, a focus adjusting lens 09, which is controlled so as to compensate a focus condition that is changed according to a voltage applied to the accelerating tube 11, is provided. Fluctuation of the trajectory of the primary electron in the aberration corrector is suppressed and the correction condition of the aberration is established by adjusting the focus adjusting lens 09 according to a setting potential of the accelerating tube 11. An optical element control unit 300 is a control device that controls each configuration element of the scanning electron microscope and controls the scanning electron microscope based on an input condition of an input device (not illustrated) or the like.

Furthermore, an intensity ratio of the magnetic field type deflector 23 and the electrostatic type deflector 24 configuring the image shift deflector is adjusted to a condition in which electrons emitted from the sample is directed to a secondary electron generating unit which generates a new secondary electron by collision of electrons emitted from the detector or the sample disposed in the vicinity of the detector. Therefore, even if the image shift of several hundred □m or more is performed, it is possible to suppress fluctuation of the yield of detected electrons. According to the configuration described above, it is possible to reduce the aberration in the high frequency component included in a deflector by suppressing the off-axis amount of the primary electron according to the movement of the field of view.

It is preferable that the focus adjusting lens 09 is located on a sample 14 side from a deflection aberration corrector 301 and the position of the objective lens object point so as not to change the incident condition to the deflection aberration corrector 301 and the position of the objective lens object point. Fluctuation of the trajectory of the primary electron in the aberration corrector is suppressed and the correction condition of the aberration is established by adjusting the focus adjusting lens 09 according to a setting potential of the accelerating tube 11.

In addition, another example of the scanning electron microscope including the deflector for moving the field of view is illustrated in FIG. 3. The optical system illustrated in FIG. 3 includes a deflection aberration corrector 301 having rotationally symmetric lenses 07 and 08, and a deflector 21, and corrects the deflection aberration generated when the image shift is performed. In addition, an off-axis amount of the primary electron is reduced at the position of a deflector 23 by applying a positive voltage determined by a range of a using image shift to the accelerating tube 11. Therefore, it is possible to suppress the aberration generated depending on the off-axis amount and simultaneously to suppress lowering of a signal electron emitted from the sample.

Next, the effect of the accelerating tube 11 commonly used for the optical system illustrated in FIGS. 1 and 3 will be described with reference to FIG. 2. In the optical system illustrated in FIG. 2, in order to allow a primary electron 51 (electron beam) to vertically reach a position on a sample 13 separated from an ideal optical axis 201 by I1, beam deflection is performed by the image shift deflector (magnetic field type deflector 23 and electrostatic type deflector 24). The primary electron 51 passes through a front focal position 202 of the objective lens 12 for the vertical landing to the sample 13. If the objective lens is short-focused for high resolution and installation of the four-direction detector, the inclination of the primary electron becomes large at the front focus and the off-axis amount (dn, an off-axis amount from the ideal optical axis 201) increases at the position of the deflector. If the field of view enters a region in which the influence of the aberration dependent on the off-axis amount by the increase in the off-axis amount, the aberration becomes apparent and lowering of the resolution and complicated control are required.

In the example, the inclination of the primary electron 51 is suppressed by disposing the accelerating tube 11 capable of applying the positive voltage so as to cover the front focal position of the objective lens 12. More specifically, the accelerating tube 13 is disposed so that a moving range of the front focal position which moves according to a change in an excitation condition of the objective lens and at least a part of the accelerating tube 13 in the ideal optical axis direction of the electron beam are set to be the same height. Normally, the accelerating tube 11 is turned OFF and the front focal distance of the objective lens 12 is so that to be short. A distance from a front focus 203 to the main surface of the objective lens can be extended and the inclination of the primary electron 51 in an acceleration space can be alleviated by applying a positive potential to the accelerating tube 11 during the large deflection. As a result, the off-axis amount generated at the lower stage position of the image shift deflector when the image shift is executed compared to a case where the accelerating tube is turned OFF (in a case of FIG. 2, the off-axis amount can be changed from dn to da). The decrease in the off-axis amount means suppression of the deflection angle (deflection signal supplied to the image shift deflector) of the image shift deflector and suppression of influence of a harmonic component of a deflection field. For the above reason, it is possible to expect the effect on controllability, resolution, and the using current (voltage) when a large image shift amount is given by applying the positive voltage to the accelerating tube. In addition, since the distance of the front focus of the objective lens is increased, it is possible to suppress the off-axis amount after the signal electron emitted from a position distant from the optical axis by the image shift passes through the objective lens. As in the example, it is possible to suppress the generation of the aberration while maintaining the size (I1) of the moving amount of the field of view by reducing the off-axis amount (deflection signal) by the image shift deflector in conjunction with the voltage application to the accelerating tube 11 compared to a case where the voltage application is not performed.

In addition, when the off-axis amount is changed from dn to da, the excitation condition (focus condition) of the objective lens is also changed in order to vertically land the electron beam on the sample 13. It is possible to maintain the vertical landing state irrespective of the image shift condition by storing a table or the like in which the excitation condition of the objective lens and the application voltage to the accelerating tube are stored in association with each other in advance, and by using the table in the voltage application control.

According to the method as illustrated in FIG. 2, it is possible not only to correct the aberration but also to suppress the generation of the aberration itself. Therefore, it is possible to perform high-accuracy and high-speed measurement and inspection without performing a complicated control or the like according to the optical condition.

In a case where a main surface of an electrostatic lens generated when a voltage is applied to the accelerating tube is generated on the electron source side from a lens main surface of the objective lens, a main surface position of a compound lens of the objective lens and the accelerating tube is separated from the sample and the focal length is increased by applying the voltage to the accelerating tube. Therefore, the resolution is lowered. Here, when the electron beam is off-axis (image shift) or large off-axis (for example, the image shift of a predetermined value or more) is performed, the voltage of the accelerating tube 11 is selectively applied. Therefore, when the image shift is not performed or when a large image shift is not performed (when the image shift of a predetermined value or less is performed), it is possible to high resolution of the device is realized and by shortening the focal distance and when the image shift is performed or when the large image shift is performed, high resolution is realized by suppressing the off-axis amount.

As described above, it is possible to realize high resolution of the device under each use condition by performing selection of an appropriate optical condition according to the use condition of the device.

Hereinafter, the scanning electron microscope including the deflector for moving the field of view will be described in further detail. The primary electron 51 which is drawn out by a first anode 02 from an electron source 01 and accelerated by a second anode 03 is focused by a first condenser lens 04 and then passes through an objective aperture 05. Thereafter, the primary electron 51 is focused by a second condenser lens 06. The primary electron 51 passing through the second condenser lens 06 enters the deflection aberration corrector 301, is deflected by the deflector 21 in a direction perpendicular to the ideal optical axis of the beam, passes through outside an axis of an aberration generating lens 07, and generates aberration necessary for correction.

Thereafter, the primary electron 51 is returned back along the ideal optical axis by the deflector 22 disposed at the focal position of a first aberration correction lens 07 and is focused on a main surface of a second aberration correction lens 08. The primary electron 51 passing through the deflection aberration corrector 301 is deflected so as to pass through the front focus of the objective lens by the deflector 23. The primary electron that is deflected passes through the acceleration space created by applying a voltage to the accelerating tube 11 and then is focused on the sample by the objective lens 12.

In the optical system illustrated in FIG. 3, in addition to the objective lens 12, the accelerating electrode 13 to which a positive voltage is applied and a negative voltage applying power source 15 that applies a negative voltage to a wafer 14 are simultaneously used so that the resolution is improved. In the scanning electron microscope illustrated in FIG. 3, a positive voltage is applied to the accelerating tube 11 disposed separately from the accelerating electrode 13 according to the range of the image shift to be used. In a case of a semi-in-lens type objective lens used for a high resolution SEM, the resolution is determined by a magnetic field distribution and a potential distribution in the vicinity of the sample. Therefore, there is an advantage that fluctuation of the resolution is reduced when the optical mode is changed by separating a booster electrode and the accelerating tube.

In addition, theoretically, in the voltage applied to the accelerating tube 11, the off-axis amount can be suppressed as the application voltage is increased, but from the viewpoint of detecting electrons emitted from the sample, it is preferable that the off-axis amount is adjusted depending on the image shift amount. Specifically, if the deflection amount of the primary electron 51 by the image shift deflector is large, a deflection operation against the electrons emitted from the sample also increases accordingly. Therefore, the trajectory of the electrons emitted from the sample can be adjusted toward a detector 10 or the like by applying a large voltage to the accelerating tube 11 as the image shift amount is large. Moreover, when the image shift amount is a predetermined value or more, control may be performed so as to apply a predetermined voltage. In addition, as described below, from the viewpoint of detecting an electron in a specific direction among the electrons emitted from the sample, if a voltage is applied to the accelerating tube 11, the trajectory of the secondary electron is changed. Therefore, a mode in which a large image shift is performed and a mode in which angle discrimination detection of the secondary electron or the like is performed are provided. It may be conceivable to apply the positive voltage to the accelerating tube 11 in a case of the former mode, and to perform control so as to turn off the voltage applied to the accelerating tube 11 in a case of the latter mode.

As a second example, an example in which an accelerating tube 11 is applied to an optical system having a shadow (four directions) detector that detects backscattered electrons emitted from a sample with a large elevation angle will be described. FIG. 4 is a view for explaining an example in which two divided accelerating tubes 11a and 11b are disposed in the vicinity of an objective lens 12. The optical system illustrated in FIG. 4 further includes shadow detectors 41 and 42. Although two detectors are illustrated in FIG. 4, the shadow detector, which is configured of four detectors in which further two detectors are also disposed in a direction perpendicular to a plane of paper around the ideal optical axis of the beam, is described.

In a case where no voltage is applied to the accelerating tubes 11a and 11b, a trajectory of a reflected electron having a large elevation angle emitted from the sample will be described. A reflected electron trajectory 52 when a voltage of the accelerating tube is 0 V is indicated by a dotted line. The reflected electron emitted in a right (left) direction is focused by a lens operation of the objective lens and then is detected by the detector 41 (42). In general, if the front focal distance of the objective lens is shortened, separability of the reflected electrons emitted to the right and left is improved. In a case where a large image shift amount is provided, it is preferable that the front focal distance is lengthened so a positive voltage is applied to the accelerating tubes 11a and 11b. In this case, a reflected electron trajectory 13 is indicated by a solid line. The reflected electron is pulled up by the influence of the positive voltage applied to the accelerating tube 11 and is detected by the detector 10. As illustrated in the example, it is possible to switch an optical mode in which a shadow contrast due to shadow (four directions) detection becomes strong by the voltage applied to the accelerating tubes 11a and 11b, and an optical mode in which a high-speed and multi-point measurement is performed for providing a large image shift amount.

More specifically, two modes of the shadow contrast image acquisition mode (first optical mode) and the high-speed and multi-point measurement mode (second optical mode) are prepared, and the two modes are capable of switching. It is conceivable to perform a control so as to selectively apply a voltage the accelerating tube when the second optical mode is selected. In addition, when the second optical mode is selected, the voltage applied to the accelerating tube may be increased relatively to the first optical mode. Furthermore, the voltage applied to the accelerating tube may be adjusted according to a magnitude of the image shift amount. In this case, the voltage applied to the accelerating tube is increased as the off-axis amount is large.

A schematic view of an optical system by a third example is illustrated in FIG. 1. In the optical system, the focus adjusting lens 9 is disposed between the detector 10 and the deflection aberration corrector 301.

An operation of the optical system is illustrated below. Due to a large deflection, when the positive voltage is applied to the accelerating tube 11 or the objective lens 14 is weakly excited, the objective lens object point which is set in the main surface of the second aberration correction lens 11 is shifted.

If the emission condition of the aberration corrector fluctuates, the correction condition is lost so that the aberration correction cannot be performed. Therefore, the focus adjusting lens 09 is operated so as to fix the position of an object surface P1 according to an amount of excitation of the accelerating tube 11 and the objective lens 14. Even if a mode is changed to an optical mode in which the amount of excitation of the accelerating tube 11 and the objective lens is adjusted and the off-axis amount of the primary electron and the secondary electron is suppressed by performing the above-described operation when the large image shift of several hundred □m is performed, the trajectory of the aberration corrector can be held. Therefore, the aberration correction can be performed in the deflected optical mode and degradation of image quality generated when the image shift is performed can be suppressed.

A fourth example is illustrated in FIG. 5. In the example, accelerating tubes 11, 13, and 13' for accelerating an entire optical path the primary electron 51 are provided and the magnetic field type deflector 23 and the electrostatic type deflector 24 for the image shift are disposed in a magnetic field of the objective lens 12. In the example, the image shift (movement of the field of view) is performed by using a preliminary deflector 25, the magnetic field type deflector 23, and the electrostatic type deflector 24. However, as in the previous examples, it is possible to suppress the off-axis amount when the image shift is performed by applying the positive voltage higher than that of another accelerating electrode to the accelerating tube 11. Therefore, it is possible to expect the same effects as those of the previous examples. Here, the electrons emitted from the sample in the optical system illustrated in the example receives a converging operation of the objective lens and a deflection operation of the deflectors 23 and 24 until the electrons reach the detector 15.

In the optical system using in-object deflection, the yield of the detection signal is changed by the deflection operation of the deflector in the objective lens. Therefore, the magnetic field type deflector 23 and the electrostatic type deflector 24 are disposed in the magnetic field of the objective lens as the image shift deflector and deflection intensities B1 and E1 of the magnetic field type deflector 23 and the electrostatic type deflector 24 are operated at a ratio expressed by Equation 1.

$$E1 = qB1 \times v0 \tag{1}$$

Here, q is an elementary charge and v0 is a velocity of the secondary electron emitted from the sample. According to such a configuration, it is possible to selectively deflect the electron beam reaching the sample without deflecting the electrons emitted from the sample.

Next, the trajectory of the primary electron and the trajectory of the secondary electron when the above-described operation is executed will be described. The primary electron 51 passing through the deflection aberration corrector 301 is preliminarily deflected by an image shift deflector 25. The primary electron which is preliminarily deflected enters outside the axis of the objective lens, is deflected by the magnetic field type deflector 23 and the electrostatic type deflector 24 disposed at the same position (within the leakage magnetic field of the objective lens) in a lens field, and is vertically landed on the sample. The deflection intensities B1 and E1 of the respective deflectors are set to the ratio at which the secondary electron goes straight. Therefore, in a state where the deflection angle necessary for the image shift is provided to the primary electron, even if the signal electron emitted from the sample passes through the positions of the deflectors 23 and 24, the signal electron can be detected by the detector 10 without receiving the deflection operation.

A secondary electron trajectory of a case of being deflected only by the magnetic field type deflector 23 is indicated by reference numeral 52. The secondary electron emitted from the sample collides the accelerating tube 11 through the trajectory of the dotted line 52 by receiving the deflection operation of the deflector 23, which makes it impossible to detect.

FIG. 7 illustrates the accelerating tube 11 which is divided into two (11 and 13). As described in the first example, theoretically, the higher voltage of the accelerating tube is, the greater the effect can be obtained. However, if a high positive voltage is applied to the accelerating tube 11, the electric field intensity of the sample surface disposed in the stage 14 increases so that there is a possibility that insulation breakdown and charge-up of the sample occur. Therefore, insulation breakdown and charge-up are suppressed by dividing the accelerating tube into two as 11 and 13, performing the acceleration of the electric field intensity of the sample surface in the accelerating tube 11, and performing the acceleration of the optical path of the primary electron 51 in the accelerating tube 13.

Moreover, when a high voltage is applied to the accelerating tube 11, a large potential difference generates between the accelerating tube 11 and the accelerating tube 13, and an electrostatic lens 31 is formed. In order to realize high resolution by the electron microscope, it is necessary to bring the sample surface and a lens main surface 32 of the objective lens 12 as close as possible to each other. However, if the electrostatic lens 31 is generated by a potential difference between the accelerating tubes 11 and 13, a compound lens of the electrostatic lens 31 and a magnetic field lens 32 is formed by the lens operation of the electrostatic lens 31, and the lens main surface is separated from the sample. In order to suppress lowering of the resolution, it is sufficient to make the objective lens main surface 32 coincide with the main surface of the electrostatic lens 31. However, in order to reduce an influence of a leakage electric field of the accelerating tube 11, it is necessary to make the accelerating tube 13 very small, which leads realization to be difficult for design reasons. Therefore, a control is performed so that in a case where it is desired to acquire an image with high resolution, the same voltage is applied to the accelerating tube 11 and the accelerating tube 13, and in a case where it is desired to execute a large movement (image shift) of the field of view, a voltage which is relatively high with respect to that of the accelerating tube 11 is applied to the accelerating tube 13. Therefore, both high resolution by causing the lens main surface to close to the sample and suppression of lowering of resolution by suppressing the off-axis amount of the beam when the image shift is performed are realized.

Similarly, if potentials of accelerating tubes 13' and 13" are increased, it is possible to reduce the aberration of the deflector and the lens in each section. However, if there is a potential difference between the accelerating tube 11 and the accelerating tubes 13' and 13", the lens operation is generated in a space generated by the potential difference and the resolution is lowered. Therefore, in a state where the image shift is not performed, in a case where it is desired to acquire an image having high resolution, the same voltage is applied to all the accelerating tubes. In a case where it is desired to largely move the field of view, it is preferable that control is performed so that the potential of a section (inside the accelerating tubes 11, 13, and 13') in which the off-axis is generated by the deflection.

As a fifth example, a flowchart of case where the high-speed and multi-point measurement is performed by using the optical system illustrated in FIG. 1 is illustrated in FIG. 6. Information of a measurement point is read from design data of a device to be measured in step 001. In step 002, the image shift range necessary for measurement is determined.

The optical mode determining unit 301 determines a necessary image shift range from a measurement point density in the design data read by a user or in step 001. The voltage and the current of the accelerating tubes 11 (13, 13', and 13") and the focus adjusting lens 09 are obtained from the image shift range determined in step 002, the obtained value is delivered to the optical element control unit 300, and a current value and a voltage value of each lens are set. Moreover, the optical element control unit 300 illustrated in FIG. 1 or the like includes an input device (not illustrated) and an input of the selection of the measurement mode, the image shift range, an address of a measurement target, or the like can be performed. Next, the stage is moved from the data of the measurement point read in step 003 to the measurement point. In step 004, the image shift amount is set to 0, the focus and stigma adjustments are performed to acquire a low magnification image of several thousand times. In this case, the focus and stigma amounts are recorded in a focus and stigma recording unit 302. A height of the wafer is estimated from a recorded focus value and a set optical condition value.

In step 005, the low magnification image acquired by a measurement position calculating unit 303 is collated and a distance from the current position of the field of view to each measurement point is calculated. In step 006, the image shift magnification and a rotation angle in the image shift direction which are fluctuated by the height of the sample are obtained by an image shift condition calculating unit 304. The optical condition of the aberration correcting unit 201 and the condition of the image shift deflectors 23 and 24 are set to perform the image shift of the distance calculated in step 006. Here, in the image shift condition calculating unit, the aberration correction condition obtained by simulation or experiment and the setting condition of the image shift deflector are made into a function, and setting current and voltage of an optical element to which a desired image shift amount is given by using the function are determined.

In step 007, the focus adjustment amount and the stigma adjustment amount which are generated when a desired image shift is performed are calculated by a focus and stigma correction amount calculating unit 305, and the focus and stigma amount are adjusted by adding the focus adjustment amount and the stigma adjustment amount to a value stored in the focus and stigma recording unit 302. In step 008, image distortion (longitudinal magnification, lateral magnification, rotation angle, and orthogonal angle) generated with the desired image shift is calculated by an image distortion correcting unit, and the image distortion is corrected by applying feedback to an input signal to a scanning coil 27.

In step 009, the image of the measurement point is acquired. In step 010, it is checked whether there is no unmeasured measurement point in an image shiftable range. In a case where there is the unmeasured measurement point in the image shiftable range, the process returns to step 006. In a case where there is no unmeasured measurement point in the image shiftable range, the process proceeds to step 011. In step 011, it is checked whether there is no unmeasured measurement point in the wafer. In a case where there is the unmeasured measurement point, the process returns to step 002 and the stage is moved. In a case where there is no unmeasured measurement point, the process proceeds to step 012 and the measurement is completed.

If the above-described procedure is used, both high resolution and wide image shift can be established by changing the setting voltage of the accelerating tube 11 according to the range (distance) of the image shift to be driven. In addition, it is possible to improve position accuracy of the image shift by calculating the height of the sample from the focus current value when an image for obtaining a distance to the measurement point after the movement of the stage is acquired (step 004), obtaining a third-order position shift amount due to the image shift magnification, the rotation direction, and distortion aberration, and performing feedback to the image shift condition. As a result, it is possible to accurately move the field of view to the measurement point.

According to the example, even if the image shift of several hundred of microns is executed, it is possible to obtain an image in which degradation of the resolution, and fluctuation of the secondary electron yield and the landing angle are reduced. Therefore, it is possible to execute the high-speed, high-accuracy, and multi-point measurement.

In order to perform the high-speed, high-accuracy, and multi-point measurement, it is preferable that simultaneous correction of the deflection chromatic aberration and the deflection geometric aberration, focus correction for keeping the waiting time until image acquisition constant, and suppression of the off-axis amount when the field of view is moved to reduce the aberration by the harmonic component of the deflector, suppression of fluctuation of the secondary electron trajectory are simultaneously.

FIG. 8 is a view illustrating an example of the scanning electron microscope including a deflector for moving the field of view. The scanning electron microscope illustrated in FIG. 8 includes an aberration correcting unit 301 having two rotationally symmetric lenses 07 and 08, a first aberration correcting deflector 21, and a second aberration correcting deflector 22. Therefore, the deflection chromatic aberration generated when the field of view is moved is corrected. In addition, a deflector for moving the field of view that is configured of a magnetic field type deflector 23 and an electrostatic type deflector 24, and a focus adjusting lens 09 which is disposed between the deflector for moving the field of view and a virtual deflection fulcrum 204 when the field of view is moved and to which a predetermined voltage or current is applied are provided. Fluctuation of the primary electron trajectory in the aberration correcting unit is suppressed and focus adjustment is performed while the correction condition of the aberration is established by controlling a voltage or a current applied to the focus adjusting lens 09 according to the moving amount of the field of view.

Hereinafter, as a sixth example, in order to move the field of view maintaining the vertical landing with high speed and high accuracy while keeping a waiting time until the image acquisition in the optical system illustrated in FIG. 8, a control for keeping deflection sensitivity (image moving amount per unit current) of the deflector 23 for moving the field of view and a control for simultaneously performing correction of the deflection geometric aberration of the objective lens 12 which becomes apparent when the field of view is largely moved will be described.

An operation of the optical system is illustrated below. The focus deviation is generated due to a field curvature aberration of the objective lens 12 when the field of view is moved by the deflector for moving the field of view. Therefore, it is necessary to adjust the focus using one of lenses. If the focus is adjusted by using a lens on the electron source 01 side from the deflector 23 for moving the field of view, the position of the objective lens object point is changed. Therefore, the deflection sensitivity of the deflector 23 for moving the field of view is changed for each movement of the field of view. If the deflection sensitivity of the deflector 23 for moving the field of view is changed, a relaxation time of a current applied to the deflector is constant so a time until an image can be acquired changes, it is impossible to keep an arbitrary movement amount of the field of view and a required time until the image can be acquired after the movement of the field of view in the moving direction, and the throughput decreases. Therefore, it is necessary to adjust the focus with the lens close to the sample 14 side from the deflector 23 for moving the field of view. In a case where the focus is adjusted by the objective lens 12, the position of the objective lens object point is not changed, but a current amount of the objective lens is changed. Therefore, the movement accuracy of the field of view may be lowered due to the influence of heat generation and hysteresis. Therefore, the focus is adjusted by the focus adjusting lens 09 when the field of view is moved. It is possible to suppress lowering of the moving accuracy of the field of view due to heat generation and hysteresis of the lens while maintaining the deflection sensitivity of the deflector 23 for moving the field of view by using an electromagnetic lens or an electrostatic lens which is less influenced by heat generation and hysteresis for the focus adjusting lens 09. In addition, in a case where the focus adjusting lens 09 and the deflection aberration corrector 301 are simultaneously used, it is possible to adjust the focus without changing the incident condition to the deflection aberration corrector 301 by disposing the focus adjusting lens 09 on the sample side from the deflection aberration corrector 301.

In addition, in a case where the field of view is greatly moved while maintaining the vertical landing, the deflection geometric aberration (deflection distortion aberration, deflection coma aberration, and the like) of the objective lens becomes apparent and the movement accuracy of the field of view is deteriorated. Therefore, the deflector 23 for moving the field of view is controlled so that a deflection trajectory 51 when the vertical landing is performed is anti-symmetric with a plane perpendicular to an optical axis 50 passing through the virtual deflection fulcrum 204 when the field of view is moved as a symmetry plane 401. A direction in which an anisotropic deflection geometric aberration (deflection distortion aberration, deflection coma aberration, and the like) is generated is reversed between the focus adjusting lens 09 and the objective lens 12 by the control. The magnitude of the deflection geometric aberration generated in the focus adjusting lens 09 and the objective lens 12 varies depending the lens strength and on the position at which the deflection trajectory 51 passes through each lens when the vertical landing is performed. However, the direction of generation of the deflection geometric aberration is determined by the symmetry of the deflection trajectory 51, so that it is necessarily reversed before and after the symmetry plane 401. Therefore, it is possible to correct or reduce the deflection geometric aberration when the field of view is moved by the arrangement of the optical system.

It is possible to perform the movement of the field of view maintaining the vertical landing with high speed and high accuracy while keeping the waiting time until image acquisition constant by the control.

An optical system of a seventh example will be described with reference to FIG. 9. The optical system includes a focus adjusting lens 09 between a deflector 23 for moving the field of view and a virtual deflection fulcrum 204 when the field of view is moved, and an accelerating tube 11 between the deflector 23 for moving the field of view and an objective lens 12. In the example, a method, in which the focus adjusting lens 09 and the accelerating tube 11 are simultaneously used and the deflection geometric aberration of the objective lens 12 and an aberration due to the harmonic component of the deflector 23 for moving the field of view are corrected or reduced at the same time, will be described.

Hereinafter, an operation of the optical system will be described. First, as described in Example 1, the deflection geometric aberration of the objective lens 12 can be corrected or reduced by controlling the deflector 23 for moving the field of view so that the deflection trajectory 51 is anti-symmetric with respect to the symmetry plane 401 when the vertical landing is performed. On the other hand, since it is difficult to correct the aberration by the lens due to the harmonic component of the deflector 23 for moving the field of view, it is necessary to control so as not to generate the aberration. Therefore, the positive voltage is applied to the accelerating tube 11. In this case, the primary electron is accelerated when the primary electron is incident on the accelerating tube 11 from the deflector 23 for moving the field of view. Therefore, the inclination of the deflection trajectory 54 is smaller than that of the trajectory 51 when the accelerating tube 11 is turned OFF. As a result, off-axis of the primary electron is reduced at the position of the deflector 23 for moving the field of view and it is possible to suppress the generation of the aberration due to the harmonic component. If the accelerating tube 11 and the deflector 23 for moving the field of view are controlled so that the trajectory after the primary electron is incident on the accelerating tube 11 coincides with the trajectory 51 in a case where the accelerating tube 11 is turned OFF, the symmetry of the deflection trajectory with respect to the symmetry plane 401 can be maintained. Therefore, it is possible to reduce the aberration of the deflector 23 for moving the field of view without affecting the correction and reduction of the deflection geometric aberration of the objective lens 12 by the control.

In addition, the focus adjusting lens 09 and the accelerating tube can be simultaneously used even in a case where the arrangement of the accelerating tube is different from the case described above. FIG. 10 illustrates an optical system in which the accelerating tubes 13 and 13' are disposed between an electron source and a deflector 23 for moving the field of view. When the positive voltage is applied to accelerating tubes 13 and 13', it is possible to reduce the aberration generated by a lens and a deflector in each section. In this case, the energy of the primary electron incident on the focus adjusting lens 09 and the objective lens 12 is higher than that of a case where the accelerating tube is turned OFF. However, it is possible to keep the deflection trajectory 51 unchanged when the vertical landing is performed by appropriately controlling a voltage or current amount applied to the focus adjusting lens 09 and the objective lens 12. Therefore, it is possible to simultaneously use the focus adjusting lens 09 and the accelerating tubes 11, 13, and 13' without affecting the deflection geometric aberration of the objective lens 12.

REFERENCE SIGNS LIST

1: electron source,
2: first anode,
3: second anode,
4: first condenser lens,
5: objective aperture,
6: second condenser lens,
7: first aberration correction lens,
8: second aberration correction lens,
9: focus adjusting lens,
10: detector,
11: accelerating tube,
12: objective lens,
13: booster electrode,
14: stage,
15: retarding voltage applying unit,
21: first aberration correcting deflector,
22: second aberration correcting deflector,
23: image shift magnetic field type deflector,
24: image shift electrostatic type deflector,
25: image shift preliminary deflector,
27: scanning coil,
41: shadow or four-direction detector 1,
42: shadow or four-direction detector 2,
50: optical axis,
51: primary electron,
52: signal electron trajectory in a case where voltage is not applied to accelerating tube,
53: signal electron trajectory in a case where voltage is applied to accelerating tube

The invention claimed is:

1. A charged particle beam device including an objective lens that focuses a charged particle beam emitted from a charged particle source and irradiates a sample with the charged particle beam, and a deflector for moving a field of view, which deflects the charged particle beam, the device comprising:
    an accelerating tube that is disposed between the deflector for moving the field of view and the objective lens;
    a power source that applies a voltage to the accelerating tube; and
    a control device that controls a voltage applied to the accelerating tube according to a deflection condition of the deflector for moving the field of view.

2. The charged particle beam device according to claim 1, wherein the accelerating tube is disposed at the same height as a front focal position of the objective lens in an irradiation direction of the charged particle beam.

3. The charged particle beam device according to claim 1, wherein the control device is configured such that in a first operating condition the field of view is not moved by the deflector for moving the field of view or image shift of a predetermined value or less is performed, and such that in a second operating condition the field of view is moved by the deflector for moving the field of view, wherein in the second operating condition, a large positive voltage is applied to the accelerating tube compared with the first operating condition.

4. The charged particle beam device according to claim 1, wherein the accelerating tube is configured of at least a first electrode disposed on the charged particle source side and a second electrode disposed on the sample side, and the control device controls a voltage applied to the first electrode according to a deflection condition of the deflector for moving the field of view.

5. The charged particle beam device according to claim 4, wherein a positive voltage is applied to the second electrode.

6. The charged particle beam device according to claim 5, wherein the control device is configured such that a in a first operating condition the field of view is not moved by the deflector for moving the field of view or image shift of a predetermined value or less is performed, and such that in a second operating condition the field of view is moved by the deflector for moving the field of view, wherein in the second operating condition, the same positive voltage is applied to the first electrode and the second electrode.

7. The charged particle beam device according to claim 1, further comprising:
a focus adjusting lens that adjusts a focus of the charged particle beam between the charged particle source and the accelerating tube,
wherein the control device controls the focus adjusting lens according to at least one of a fluctuation of a voltage applied to the accelerating tube and a fluctuation of a focal distance of the objective lens.

8. The charged particle beam device according to claim 1, wherein the deflector for moving the field of view is configured of a magnetic field type deflector and an electrostatic type deflector.

9. The charged particle beam device according to claim 8, wherein the control device adjusts a deflection ratio of the magnetic field type deflector and the electrostatic type deflector so as to move the field of view of the charged particle beam under a condition of guiding electrons emitted from the sample in a predetermined direction.

10. The charged particle beam device according to claim 8, wherein the magnetic field type deflector and the electrostatic type deflector are disposed in a leakage magnetic field of the objective lens.

11. A charged particle beam device including an objective lens that focuses a charged particle beam emitted from a charged particle source and irradiates a sample with the charged particle beam, and a deflector for moving a field of view, which deflects the charged particle beam, the device comprising:
a focus adjusting lens that is disposed on a sample side from a position of the objective lens object point;
a power source that applies a voltage or a current to the focus adjusting lens; and
a control device that controls a voltage or a current applied to the focus adjusting lens according to a deflection condition of the deflector for moving the field of view.

12. The charged particle beam device according to claim 11,
wherein the focus adjusting lens is disposed between the deflector for moving the field of view and a virtual deflection fulcrum when the field of view is moved in an irradiation direction of the charged particle beam.

13. The charged particle beam device according to claim 11,
wherein the deflector for moving the field of view is configured of a magnetic field type deflector and an electrostatic type deflector.

14. The charged particle beam device according to claim 13,
wherein the control device adjusts a deflection ratio of the magnetic field type deflector and the electrostatic type deflector so as to move the field of view of the charged particle beam under a condition of guiding electrons emitted from the sample in a predetermined direction.

15. The charged particle beam device according to claim 13,
wherein the magnetic field type deflector and the electrostatic type deflector are disposed in a leakage magnetic field of the objective lens.

* * * * *